(12) United States Patent
Miyajima (10) Patent No.: US 6,365,979 B1
(45) Date of Patent: Apr. 2, 2002

(54) SEMICONDUCTOR DEVICE AND MANUFACTURING METHOD THEREOF

(75) Inventor: Kenji Miyajima, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/262,741

(22) Filed: Mar. 5, 1999

(30) Foreign Application Priority Data

Mar. 6, 1998 (JP) .......................................... 10-055563

(51) Int. Cl.[7] .......................... H01L 23/48; H01L 23/52; H01L 29/40
(52) U.S. Cl. ....................... 257/787; 257/794; 257/793; 257/693
(58) Field of Search ................................ 257/787, 693, 257/793, 794, 790; 438/112, 124, 127

(56) References Cited

U.S. PATENT DOCUMENTS

| | | | |
|---|---|---|---|
| 5,160,783 A | * 11/1992 | Nemoto et al. | 428/261 |
| 5,241,133 A | * 8/1993 | Mullen, III et al. | 257/693 |
| 5,336,931 A | * 8/1994 | Juskey et al. | 257/787 |
| 5,547,730 A | * 8/1996 | Weiblen et al. | 428/76 |
| 5,808,873 A | * 9/1998 | Celaya et al. | 361/760 |

FOREIGN PATENT DOCUMENTS

JP          3-228355        * 10/1991

* cited by examiner

Primary Examiner—Jhihan B Clark
(74) Attorney, Agent, or Firm—Finnegan, Henderson, Farabow, Garrett & Dunner, L.L.P.

(57) ABSTRACT

In this semiconductor device, immediate below a mold line M in a surface where an inner lead of a wiring substrate composed of a BT resin impregnated glass cloth or the like is formed, a second solder resist layer is stacked on a first solder resist layer to form a protrusion of a predetermined width. Then, on a predetermined position of the wiring substrate, a semiconductor element is assembled by wire bonding and an assembled part thereof is molded by a resin layer. Further, on the other surface of the wiring substrate, bumps are formed. Such a semiconductor device is separated by use of a slit hole formed on the wiring substrate in advance in conformity with a mold line M. In this structure, in a step of molding, since a resin is not forced outside of a pushing face of a metal mold to form a burr or the like, a thin and small resin molded semiconductor device of excellent appearance and characteristic can be obtained. Further, due to separation by use of a slit hole, a separating operation in the final step becomes easy, in addition, since a separating margin is hardly required, a CPS or the like can be made further smaller.

4 Claims, 7 Drawing Sheets

SEMICONDUCTOR DEVICE AND MANUFACTURING METHOD THEREOF

BACKGROUND OF THE INVENTION

1. Field of the Invention

Present invention relates to semiconductor devices and manufacturing methods thereof, in particular, relates to thin and small resin encapsulated semiconductor devices suitable for portable devices such as cellular phones and video cameras, and manufacturing methods thereof.

2. Description of Related Art

Recently, as thin and small semiconductor devices, chip size packages (CSP) of which the external form are formed in conformity with the size of a semiconductor element (semiconductor chip) have been developed. Among them, a fine pitch area package, the pitch between terminals of which is narrow, is seen as a promising candidate.

A thin area package of fine pitch is broadly divided into one that employs an insulating resin film as a matrix, and the other one that employs a resin impregnated glass cloth substrate of rigid frame as a matrix. In particular, from a reliability point of view, the use of the latter one is being studied.

However, in the CSP in which a substrate of a resin impregnated glass cloth is employed as a matrix, it is difficult to cut off the substrate in the neighborhood of the external form line (mold line) of the molded resin layer. Accordingly, there is such a problem that the external form of a package becomes greatly larger than the external form of the molded resin layer.

That is, when manufacturing a CSP, die bonding and the electrical connection wire bonding of a semiconductor chip is carried out in this order to a wiring substrate having wiring patterns and holes for continuity. Thereafter, a metal mold is put on outside of the semiconductor chip and an epoxy-resin or the like is transfer molded in the metal mold. Thereby, a resin sealed layer (molded resin layer) is formed. Then, after solder bumps or the like are formed as external connecting terminals, in the last, along the mold line, the wiring substrate is cut.

However, in the step of forming the molded resin layer, from a gap between a pushing face of the metal mold and the wiring substrate, the mold resin is forced outside to stick firmly on the wiring substrate, resulting in a burr. The length of the burr reaches even 0.3 to 1.2 mm. That makes difficult to separate the wiring substrate at a portion of the burr. Accordingly, it is required to cut at a position more than the length of the burr apart from the mold line, resulting in a problem that the external form of the package becomes larger by 0.6 to 2.4 mm than that of the molded resin layer.

Further, upon cutting a wiring substrate, though different according to the thickness of the substrate, cutting accuracy of a tool or the like, a large excising margin (cutting margin) is required. Consequently, the demand for smaller size can not be fully satisfied. Further, since the cutting tools wear down rapidly to make necessary complicated management of the tools, in addition, to tend to lead to the poor cutting, the cost reduction was difficult.

SUMMARY OF THE INVENTION

The present invention was carried out to solve these problems. An object of the present invention is to provide a semiconductor device that is molded by a molded resin layer, thin, small and highly reliable, and a method of manufacturing efficiently such a semiconductor device.

This invention is disclosed in Japanese Patent Application No. 10-055563 on Mar. 6, 1998, and the entire disclosure thereof is incorporated herein by reference.

The first aspect of the present invention relates to a semiconductor device.

The semiconductor device comprises a wiring substrate having a wiring layer on at least one main face of a substrate composed of a resin impregnated glass cloth, a semiconductor element mounted and assembled on the main face of the wiring substrate, a molded resin layer covering and molding an outside of the semiconductor element, and a plurality of external connecting terminals disposed on the other main face of the wiring substrate. Here, below an external form line of the molded resin layer and between the molded resin layer and the wiring substrate, a protrusion comprising an insulating resin is formed.

The second aspect of the present invention relates to a manufacturing method of a semiconductor device.

The manufacturing method comprises a step of forming a wiring layer on at least one main face of a substrate composed of a resin impregnated glass cloth, a step of forming a protrusion mainly consisting of an insulating resin on a first area on the wiring substrate thereon the wiring layer is formed, a step of mounting and assembling a semiconductor element on an area inside of the first area of the wiring substrate, a step of pressurizing a pushing face of a metal mold against the protrusion formed on the wiring substrate to carry out molding of an insulating resin, thereby forming a molded resin layer outside of the semiconductor element, and a step of forming an external connecting terminal on the other main face of the wiring substrate.

The third aspect of the present invention relates to a manufacturing method of a semiconductor device.

The manufacturing method comprises a step of forming a wiring layer on at least one main face of a substrate composed of a resin impregnated glass cloth, a step of forming a protrusion consisting of an insulating resin on a first area on a wiring substrate thereon the wiring layer is formed, a step of, in the first area of the wiring substrate, cutting leaving a part of the protrusion to form a slit hole, a step of mounting and assembling a semiconductor element on an area inside of the first area of the wiring substrate, a step of pressurizing a pushing face of a metal mold against the protrusion left on the wiring substrate to carry out molding of an insulating resin, thereby forming a molded resin layer outside of the semiconductor element, a step of forming an external connecting terminal on the other main face of the wiring substrate; and a step of, in the wiring substrate thereon the external connecting terminal is formed, cutting between the slit holes to separate an inside molded body.

In the semiconductor device and the manufacturing method thereof of the present invention, as the substrate of the resin impregnated glass cloth, one that is obtained by stacking a prepreg, in which an insulating resin such as an epoxy resin, a BT resin or the like is impregnated, into a glass cloth, and by heating/pressing the same, can be employed. The thickness of such an insulating substrate is preferable to be in the range of from 0.08 to 0.30 mm. Incidentally, the BT resin is an addition polymerized thermosetting resin mainly consisting of bismaleimid and triazine. This resin impregnated substrate is excellent in heat resistance and insulating characteristic, and has a good processing characteristic.

In the present invention, on at least one main face of said resin impregnated substrate, a wiring layer of such as inner leads, a signal line or the like is formed, further, on a predetermined position, via holes for extracting the wiring layer to the other main face is bored. Thus, a wiring substrate is obtained.

Here, the pitch and arrangement of the inner leads are designated according to the pitch and arrangement of electrode terminals of the semiconductor element being assembled. Then, the wiring layer including the inner leads is formed by photo-patterning (photo-etching) a conductive metallic layer such as a copper foil or the like disposed on one surface or both surfaces of the substrate of the resin impregnated substrate. Further, the boring of the via holes can be carried out by boring, with a drill of fine diameter or the like, one in which a plurality of the wiring substrates are stacked.

In the present invention, immediate below the external form line (mold line) of the molded resin layer on the wiring substrate, a protrusion consisting of an insulating resin is formed. Thereby, in the step of forming the molded resin layer, the protrusion is pressed against a pushing face of a metal mold to make an intimate contact and seal a gap between the metal mold and the wiring substrate. As a result of this, the molded resin is prevented from being forced outside of the pushing face of the metal mold.

Thus, the protrusion consisting of the insulating resin formed on the wiring substrate, by making an intimate contact with the pushing face of the metal mold, prevents the molded resin from being forced out. For this, it is necessary for the protrusion to have an enough height and a flat part of sufficient magnitude (area) thereon. The protrusion of enough height and flatness is difficult to be formed in a single layer. Accordingly, in the present invention, the protrusion is preferable to be formed by stacking at least two layers of the resin layers.

Further, in such a protrusion where two or more of the resin layers are stacked, an underlying resin layer is preferable to be a protective layer consisting of an insulating resin formed on the wiring substrate covering the wiring layer. As such a protective layer, there is a solder resist layer which has a function through protection of the wiring layer to prevent short-circuit or the like from occurring. Further, this solder resist layer exists as a strength reinforcement of connecting pads of a ball grid array (BGA) package in which, in order to prevent Ni/Au plating layer from sticking, external connecting terminals of the package are generally replaced by the solder balls.

In the present invention, two or more layers of such a solder resist layer are stacked immediate below the mold line with a predetermined width to form a protrusion projected toward the thickness direction compared with the other area.

More specific, the thickness of one layer of the solder resist layer is preferable to be in the range of from 15 to 40 $\mu$m, and the thickness of the protrusion stacked two or more layers is preferable to be in the range of from 30 to 80 $\mu$m. In addition, by taking into account the shift of the metal mold and the accuracy of the resist pattern, as to the magnitude of the protrusion due to stacking of two or more layers, the width of the portions inside and outside the mold line is preferable to be disposed to be 100 $\mu$m or more, respectively.

Thus, in a structure where two or more of the resin layers (solder resist layer) are stacked to form a protrusion, in addition to being capable of obtaining the sufficient height for the protrusion, due to stacking, the step (the difference in level) on the upper surface is absorbed and alleviated and the protrusion of high flatness can be obtained. That is, the wiring pattern on the insulating substrate being relatively thick such as approximately 18 $\mu$m in its thickness, only one solder resist layer is insufficient to absorb the step between the insulating substrate and the wiring pattern, to leave a step on the upper surface of the protrusion. However, upon stacking two of the solder layers to form a protrusion, there can be formed a protrusion that has hardly a gap on the upper surface (3 $\mu$m or less), and of high flatness.

Here, two or more of the solder resist layers constituting the protrusion may be the layers of consisting of the same insulating resin, or may be the layers of consisting of different insulating resins. However, the underlying solder resist layer is preferable to be constituted of the same material with the solder resist layer formed inside the mold line to protect the wiring layer or the like, and to be formed by the same coating step. Further, the underlying solder resist layer is preferable to be a photo-setting solder resist layer of excellent patterning accuracy, and the upper solder resist layer stacked thereon is preferable to be a thermosetting solder resist layer of excellent processing characteristic such as cutting characteristic or the like.

In the present invention, as the external connecting terminals formed on the other main face of the wiring substrate thereon the wiring layer or the like is formed, there are bumps of ball shape mainly consisting of, for instance, a solder based on Pb/Sn, the bumps being arranged in grid. Then, the formation of such solder bumps can be carried out by mounting while aligning the solder balls formed on, for instance, a bump arrangement plate on the wiring layer (connecting pad) of the other main face of the wiring substrate, to carry out reflow soldering.

Further, in the present invention, in the area where the protrusion of the wiring substrate is formed, in conformity to the external dimension of a semiconductor device to be manufactured, that is, in conformity to the external form line (mold line) of the molded resin layer being formed in the later step, slit holes for separation can be formed. The shape of the slit hole is preferable to have a shape of a rectangle conformed to the mold line, and to be formed with short connecting portions remained at the four corners. For instance, they can be formed by die cutting with a metal mold.

When such slit holes are formed in the wiring substrate, only by cutting the connecting portions, an inside molded body can be easily separated from the surrounding frame portion. Further, when the slit holes are formed on the wiring substrate, since a marginal length (cutting margin) is hardly required to adopt, the slit holes can be formed on the position of the mold line, resulting in a smaller size of a semiconductor device such as a CSP or the like. Still further, an edge surface of an internal circumference of a slit hole formed by die cutting or the like becomes as it is an edge surface of an external circumference of the wiring substrate. Accordingly, an external edge surface of more smooth than the cutting plane due to the cutting tools or the like can be obtained.

DETAILED DESCRIPTION OF THE PREFERRED EMBODIMENTS

In the following, the preferred embodiments of the present invention will be described.

Embodiment 1

Figure 1:
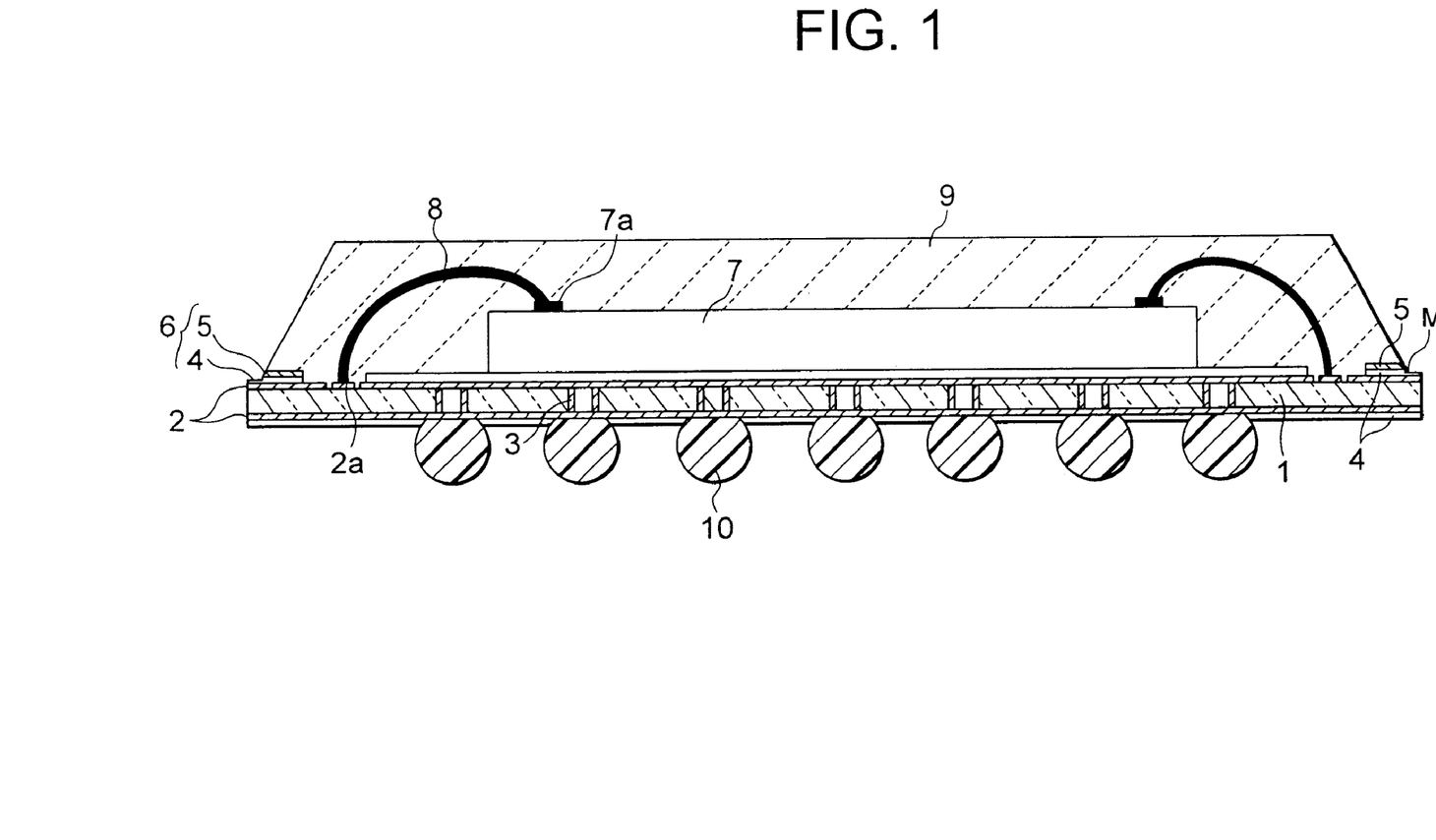
FIG. 1 is a sectional diagram showing the first embodiment of a semiconductor device of the present invention.

FIG. 1 is a cross sectional diagram showing the first embodiment of a semiconductor device of the present invention.

In the same figure, reference numeral 1 denotes an insulating substrate such as a substrate made of a BT resin impregnated glass cloth. On one main face of the insulating substrate 1, a wiring layer 2 such as inner leads 2a and signal lines or the like are disposed, on the other surface, a wiring layer 2 is disposed, respectively, and at the predetermined positions, via holes 3 are formed.

Further, to the wiring substrate (thickness; 0.10 to 0.34 mm) thereon disposed such the wiring layer 2 or the like, a first solder resist layer 4 and a second solder resist layer 5 (each thickness; 15 to 40 $\mu$m) are disposed at the predetermined positions, respectively, and these solder resist layers 4 and 5 are stacked immediate below the external form line (mold line) M of molded resin layers being described later, to form a protrusion 6. The protrusion 6 has a thickness of 30 to 80 $\mu$m, and is formed with a width of 100 $\mu$m or more inside and outside of the mold line 6, respectively.

That is, as the first solder resist layer 4, a layer of a photo-setting solder resist of excellent patterning accuracy such as PSR-4000 AUS (trade name of a product of Taiyo Ink Co. Ltd.) is formed covering the necessary wiring layer 2 on both surfaces of the wiring substrate. Then, in the surface where the inner leads are formed, on the first solder resist layer 4 formed immediate below the mold line M, as the second solder resist layer 5, a layer of a thermosetting solder resist of excellent workability such as a CCR-232CFV (trade name of a product of Asahi Chemical Laboratory Co. Ltd.) is stacked with a width of 200 $\mu$m or more from the external periphery of the substrate.

Further, on the predetermined positions (island portions) of the surface where the inner leads 2a are to be formed, a semiconductor element 7 is die bonded with a face up, and an electrode terminal 7a of the semiconductor element 7 and the inner lead 2a are connected electrically through a Au wire 8. Then, outside of thus assembled semiconductor element 7, a molded resin layer 9 consisting of an epoxy resin is disposed and the connecting parts are molded. Still further, on the wiring layer 2 (connecting pad) of the other surface of thus resin molded wiring substrate, ball-like solder bumps 10 are disposed.

A semiconductor device of such a structure is manufactured with the following method.

FIG. 2A through FIG. 2F are diagrams showing, with cross-sections, the respective steps of the first embodiment of the manufacturing method of the semiconductor device.

Figure 2A:
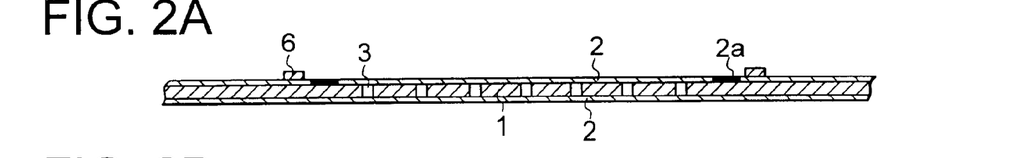
FIG. 2A, FIG. 2B, FIG. 2C, FIG. 2D, FIG. 2E and FIG. 2F are diagrams showing with cross-sections the respective steps of the first embodiment of a manufacturing method of a semiconductor device.

As shown in FIG. 2A, on a double-side copper-clad laminate where, on both surfaces of an insulating substrate 1 such as a substrate of a BT resin impregnated glass cloth, copper foils are stuck, along a length direction, with a predetermined distance apart, holes for transferring and holes for aligning are bored, respectively. Thereafter, in a portion where each semiconductor device is to be formed, the copper foils on the both surfaces are photo-patterned, respectively, thereby, the wiring layer 2 such as the inner leads 2a and the signal lines or the like are formed. Further, holes for connecting electrically between the wiring layers 2 on the both surfaces are bored with a drill or the like, thereafter, to the internal surface of the hole, copper plating is carried out to form a via hole 3.

Subsequently, on the predetermined areas of the both surfaces of the wiring substrate thereon the wiring layers 2 or the like were thus formed, as the first solder resist, PSR-4000 AUS is coated and cured. Thereafter, in one surface (the surface where the inner lead 2a was to be formed), from outside of the position where the mold line is to be formed toward inside thereof, with the predetermined width, CCR-232CFV being the second solder resist is coated and cured. Thereby, immediate below the mold line, the second solder resist layer is stacked on the first solder resist layer to form a protrusion 6.

Figure 3A:
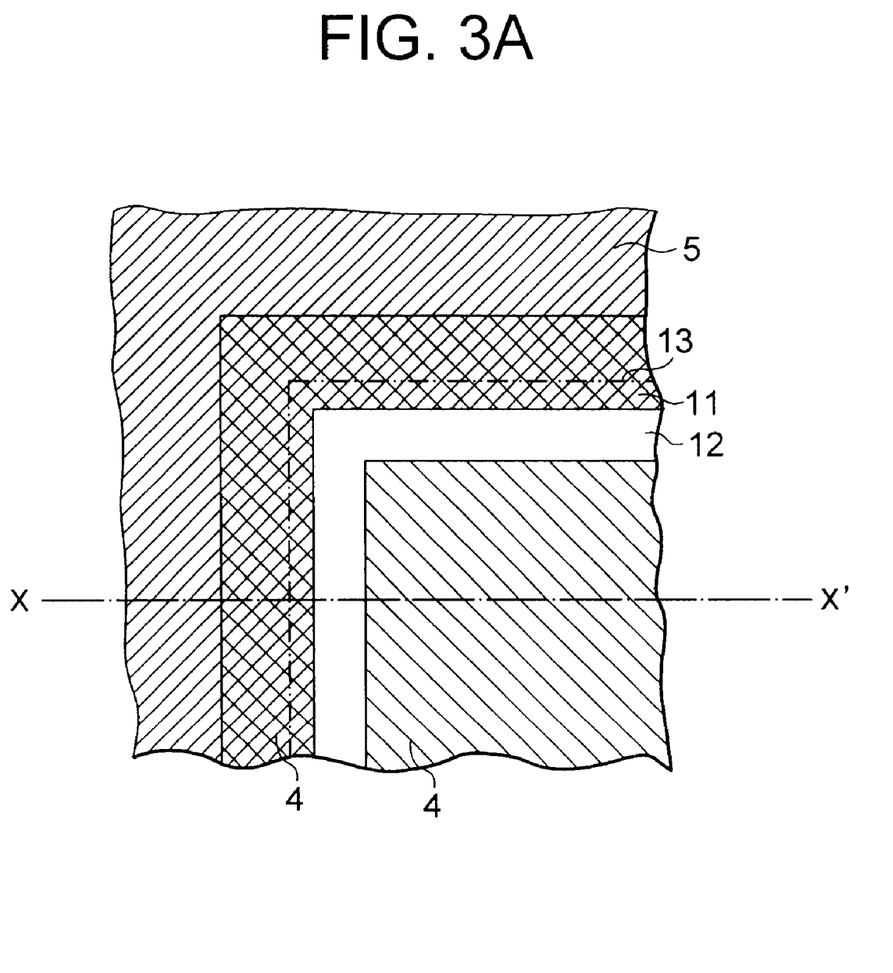
FIG. 3A and FIG. 3B are a plan view and an X–X' cross section showing schematically a constitution of a wiring substrate after a solder resist layer is formed in the manufacturing method of the first embodiment.
Figure 3B:
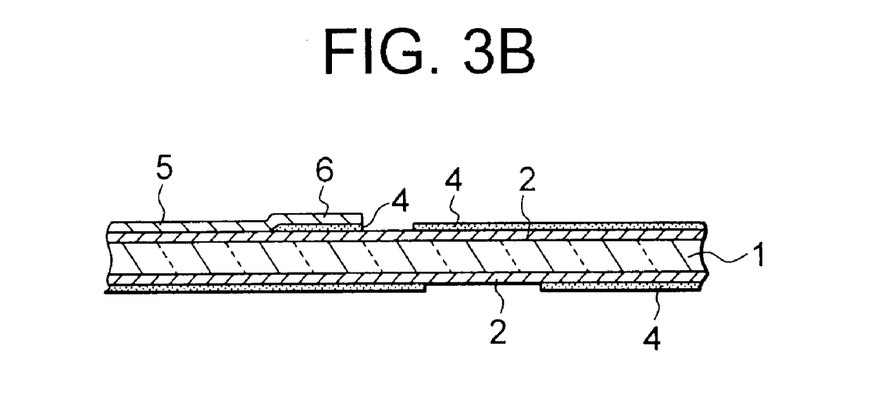

Here, schematical constitutions of the wiring substrate after the formation of the first solder resist layer and the second solder resist layer are shown in FIG. 3A and FIG. 3B with exploded diagrams. Incidentally, in these figures, the via holes are omitted from illustration. In FIG. 3A, reference numeral 11 denotes an area where a protrusion is formed by stacking the first solder resist layer 4 and the second solder resist layer 5, reference numeral 12 denotes a portion where inner leads are to be disposed, and reference numeral 13 denotes a position where a mold line is being formed.

Figure 2B:
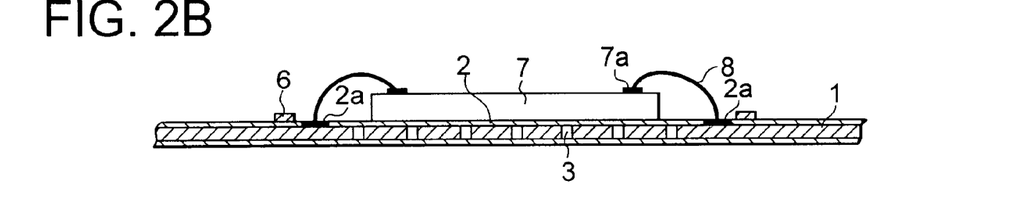

Then, as shown in FIG. 2B, on an island portion of the wiring substrate, the semiconductor element 7 disposed with face-up position is adhered and fixed (die bonded) with an insulating adherent such as an epoxy resin. Thereafter, an electrode terminal 7a of the semiconductor element 7 and the inner lead 2a are connected through with a Au wire 8.

Figure 2C:
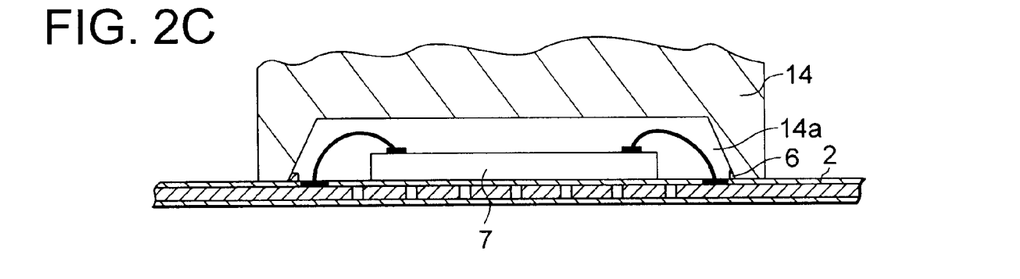
Figure 2D:
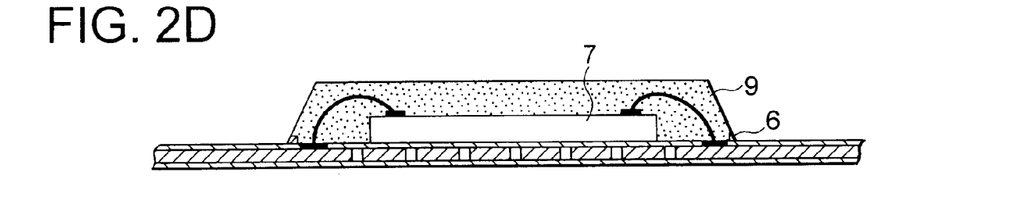

Then, outside of the connecting portion of the semiconductor element 7, an epoxy resin is molded with transfer molding. In the molding step, as shown in FIG. 2C, against the protrusion 6 formed on the wiring substrate, a pushing face of a metal mold 14 is disposed pressing, and the epoxy resin is injected under pressure to go into the cavity 14a of the metal mold 14, to cure. Thus, as shown in FIG. 2D, a molded resin layer 9 is formed.

Figure 2E:
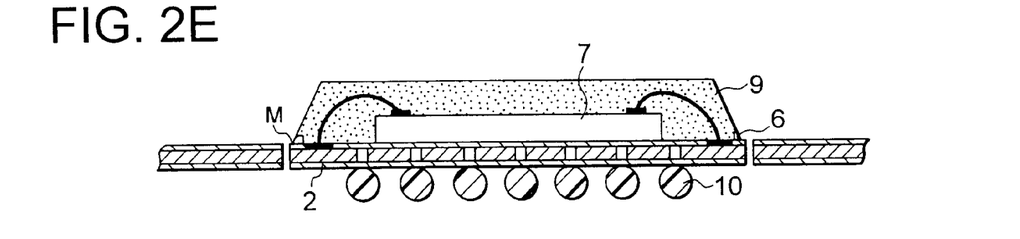

Next, as shown in FIG. 2E, on the connecting pad of the rear surface of the wiring substrate molded by the mold resin, the solder balls are mounted aligned, to form the bump 10 by reflowing.

Figure 2F:
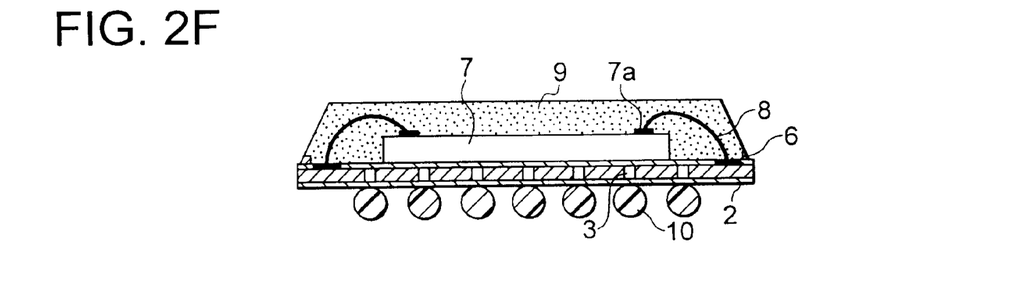

Thereafter, with an ordinary cutting tool, along the mold line M, the wiring substrate is cut to separate the inside molded body. Thus, as shown in FIG. 2F, separated semiconductor devices are obtained.

In such the first embodiment constituted as described above, on the wiring substrate immediate below the mold line M, since a protrusion 6 stacked the first solder resist layer 4 and the second solder resist layer 5 is disposed with a predetermined width (with widths of 100 μm or more inside and outside of the mold line M, respectively), in the step of forming a molded resin layer 9, upon pressing the pushing face of the metal mold 14 against the protrusion 6, the second solder resist layer 5 being an upper layer of the protrusion 6 is a little bit collapsed by pressurization, to form an intimate contact with the pushing face of the metal mold without leaving a gap. As a result of this, the mold resin pressurized inside the metal mold 14 is not forced outside of the gap of the pushing face of the metal mold, resulting in no occurrence of the burr.

Accordingly, the wiring substrate can be cut at the extremely close position to the mold line M, thereby chip size packages (CSP) of small size and excellent appearance and characteristic can be obtained.

Next, the second embodiment of a manufacturing method of the semiconductor device shown in FIG. 1 will be described.

Embodiment 2

Figure 4A:
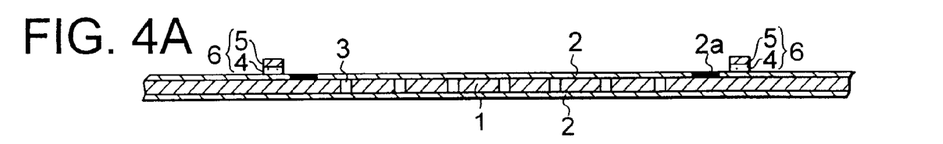
FIG. 4A, FIG. 4B, FIG. 4C, FIG. 4D, FIG. 4E, FIG. 4F and FIG. 4G are diagrams showing with cross-sections the second embodiment of the manufacturing method of a semiconductor device.

As shown in FIG. 4A, on a double-side copper-clad laminate of a thickness of 0.10 to 0.34 mm where, on both surfaces of an insulating substrate 1 such as a BT resin impregnated glass cloth, copper foils are stuck, along a length direction, with a predetermined distance apart, holes for transfer and holes for alignment are bored, respectively. Thereafter, in a portion where each semiconductor device is to be formed, the copper foils on the both surfaces are photo-patterned, respectively, thereby, the wiring layer 2 such as the inner leads 2a and signal lines or the like is formed. Further, holes are bored, thereafter, on the internal surface of the hole, copper plating is carried out to form a via hole 3.

Subsequently, on the predetermined areas of the both surfaces of the wiring substrate thereon the wiring layers 2 or the like were thus formed, a photo-setting solder resist is coated and cured. Thereafter, in the surface where inner leads 2a were to be formed, from outside of the position where the mold line is to be formed toward inside thereof, with the predetermined width, a thermosetting solder resist is coated and cured. Thereby, immediate below the mold line, the second solder resist layer 5 is stacked on the first solder resist layer 4 to form a protrusion 6.

Figure 5A:
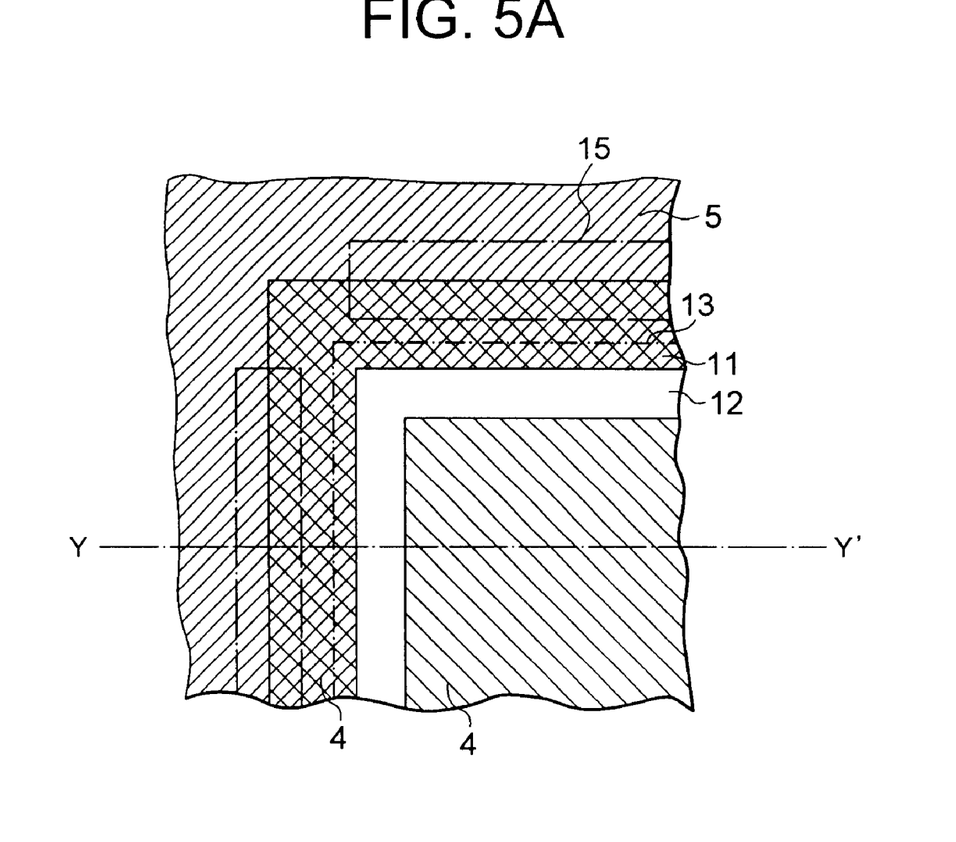
FIG. 5A and FIG. 5B are a plan view and a Y–Y' cross section showing schematically, in the manufacturing method of the second embodiment, a constitution of a wiring substrate after a solder resist layer is formed.
Figure 5B:
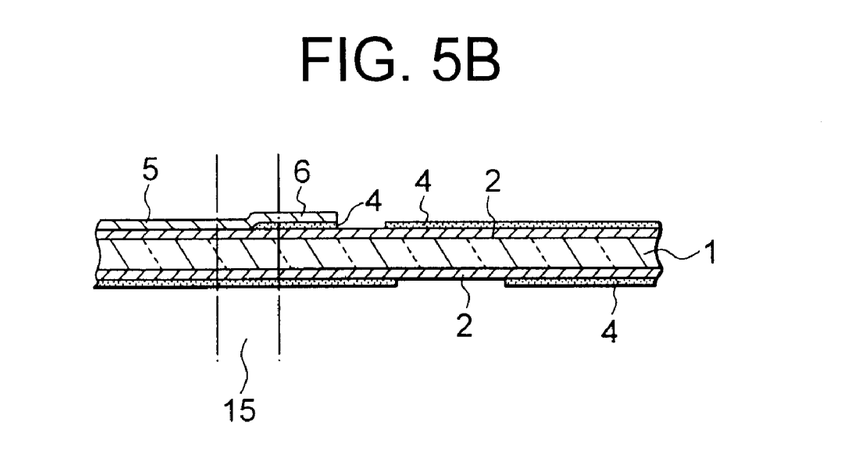

Here, an outline constitution of the wiring substrate after formation of the first and second solder resist layers 4 and 5 are shown exploded in FIG. 5A and FIG. 5B, respectively. Incidentally, in these figures, for the identical portions with FIG. 3A and FIG. 3B, the identical reference numbers are given and the description thereof is omitted. Further, the via hole is omitted from showing in the figure. In FIG. 5, reference numeral 15 denotes a position where a slit is to be formed.

Figure 4B:
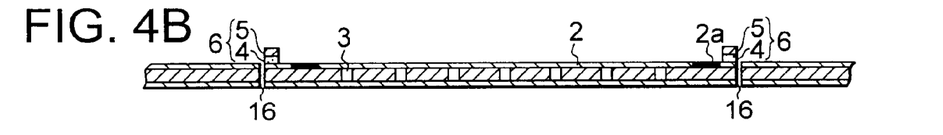

Next, as shown in FIG. 4B, 100 to 200 μm outside of the external form line (mold line) M of the molded resin layer being formed in the later step, slit holes 16 of which width are 0.4 to 1.0 mm and of which four corners are left without cutting, respectively, are formed by die-cutting with a metal mold.

Figure 6:
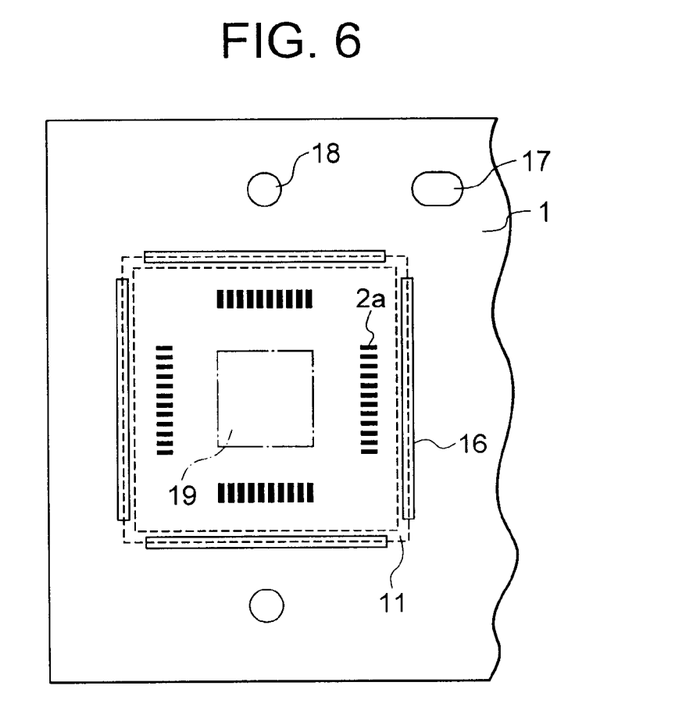
FIG. 6 is a plan view, in the second embodiment of the manufacturing method, showing schematically a shape of a wiring substrate (a surface thereon an inner lead is formed) after slit holes are bored.

An outline shape of a surface where inner leads are formed of the wiring substrate is shown in FIG. 6. In the figure, reference numerals 16, 17, 18 and 19 denote a slit hole, a hole for transfer, a hole for alignment, and an island portion for mounting a semiconductor element, respectively.

Further, an area where a protrusion is formed by stacking the first solder resist layer and the second solder resist layer, as identical as in FIG. 5A, is shown with a reference numeral 11.

Figure 4C:
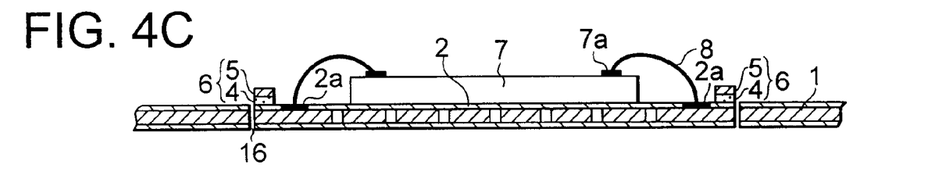

Then, as shown in FIG. 4C, on an island portion of the wiring substrate, a semiconductor element 7 is disposed with a face up to die bond with an insulating adherent. Thereafter, an electrode terminal 7a of the semiconductor element 7 and an inner lead 2a are connected through a Au wire.

Figure 4D:
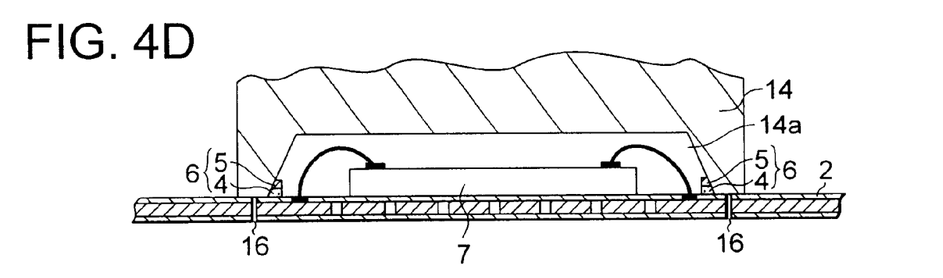
Figure 4E:
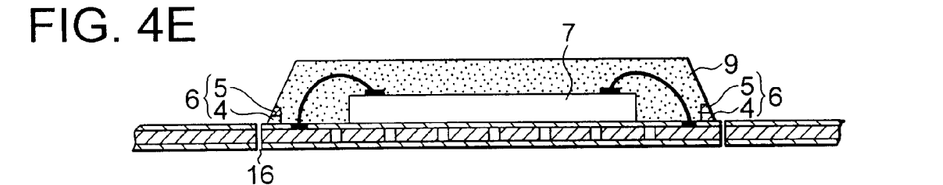

Then, as shown in FIG. 4D, outside of the connecting portion of the semiconductor element 7, an epoxy resin is transfer molded with a metal mold 14. In the molding step, the metal mold 14 is disposed on the wiring substrate straddling the slit hole 16, and the pushing face of the metal mold is pressed down on the protrusion 6 formed on the wiring substrate. Then, inside of the cavity 14a of the metal mold 14, the epoxy resin is injected under pressure, to cure. Thus, as shown in FIG. 4E, the molded resin layer 9 is formed.

Figure 4F:
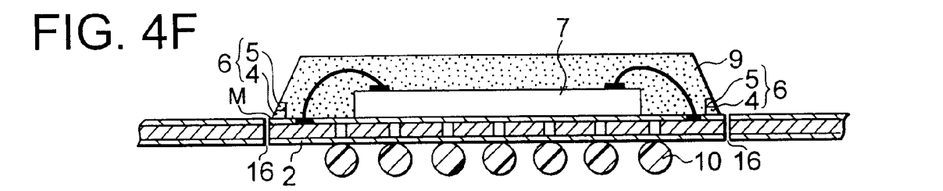

Next, as shown in FIG. 4F, on a connecting pad on the rear surface of the wiring substrate molded by the mold resin, solder balls are aligned to mount and re-flowed to form bumps 10.

Figure 4G:
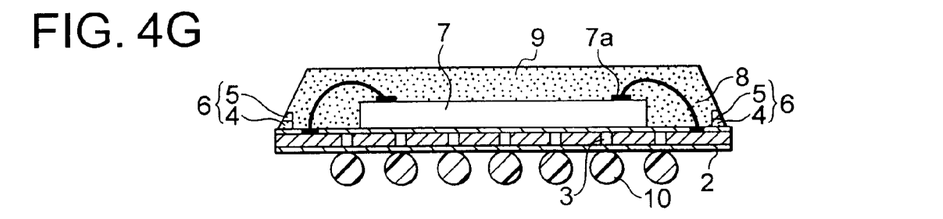

Thereafter, separation is carried out by use of slit holes 16. That is to say, connecting portions of the slit holes 16 formed in advance on the wiring substrate in conformity with the mold line M are cut respectively to separate the inside molded body from an outside frame portion. Thus, as shown in FIG. 4G, a semiconductor device is obtained.

Figure 7:
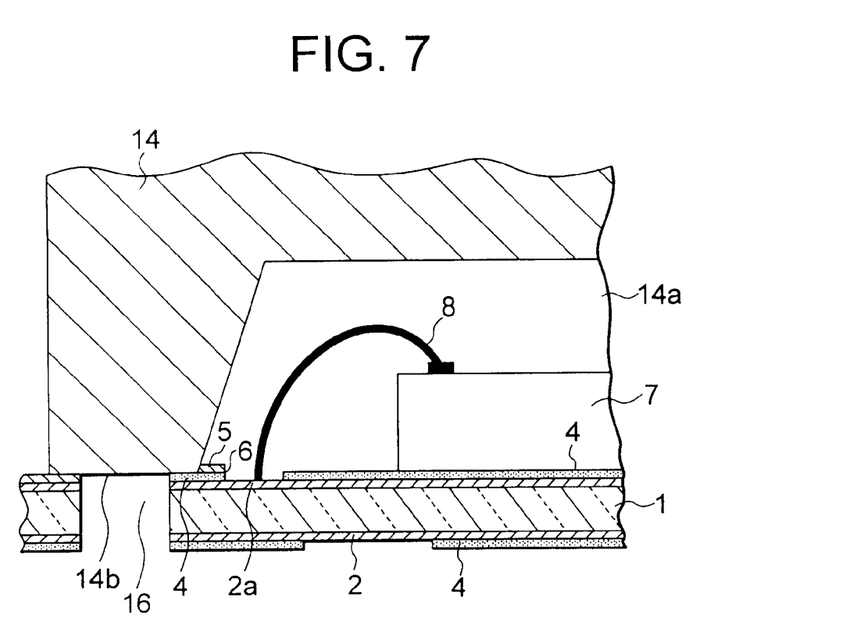
FIG. 7 is an enlarged sectional diagram showing a formation step of a molded resin layer in the second embodiment.
Figure 8:
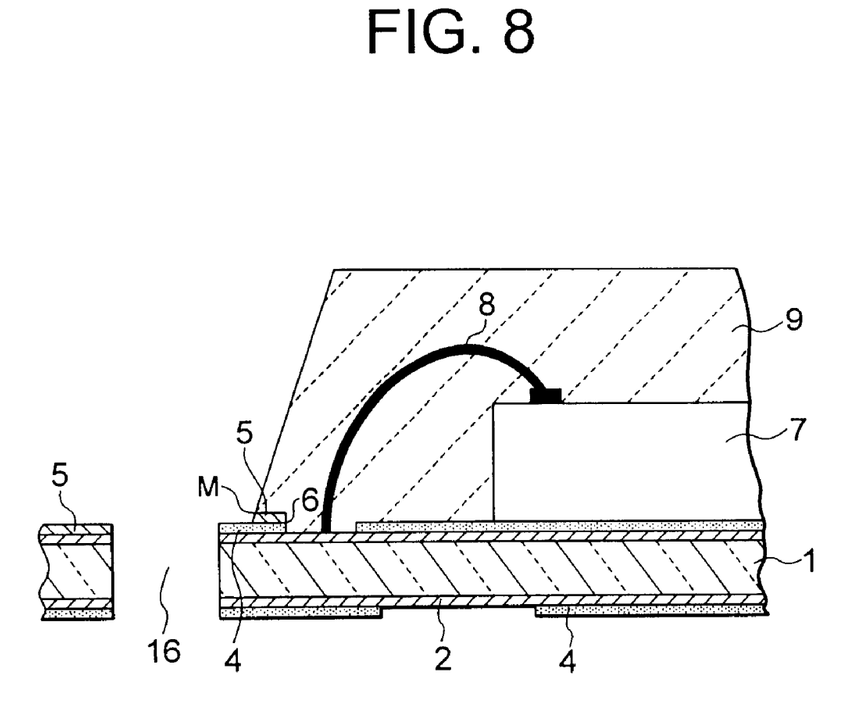
FIG. 8 is a cross section, in the second embodiment, showing a state where a metal mold is removed after a molded resin layer is formed.

In the second embodiment thus constituted, on the wiring substrate immediate below the mold line M, the first solder resist layer 4 and the second solder resist layer 5 are stacked to form a protrusion 6 of a predetermined width. Then, in the step of forming the molded resin layer 9 as shown exploded in FIG. 7, the pushing face 14b of the metal mold 14 disposed straddling the slit hole 16 is pressed against the protrusion 6. Thereby, the second solder resist layer 5 which is the upper layer of the protrusion 6 is a little bit collapsed by pressurization, to make an intimate contact with the pushing face 14b of the metal mold without leaving a gap. As a result of this, the mold resin forced into the metal mold 14 does not go outside of the pushing face 14b of the metal mold. As shown in FIG. 8, the molded resin layer 9 of free from burr, and of excellent appearance and characteristic can be formed.

Further, in the step of forming the slit hole 16, for each protrusion 6 stacked two of the solder resist layer, die-cutting of the wiring substrate is carried out. Accordingly, the slit hole 16 can be cut easily and efficiently. Further, such a protrusion 6 has a structure that stacks, on the first solder resist layer 4 consisting of a photo-setting solder resist of excellent patterning accuracy the second solder resist layer 5 consisting of a thermosetting solder resist of excellent cutting workability or the like. Accordingly the formation of the slit holes due to die cutting is further easily carried out.

Further, since the slit hole 16 formed in advance on the wiring substrate can be used for separation as it is, in addition to the easy separation, the more smooth circumference edge surface, compared with the cutting plane due to a cutting tool or the like, can be obtained. Further, the formation of the slit hole 16 is carried out along the mold line M, and the margin length (separating margin) from this line is hardly necessary. Accordingly, a semiconductor device such as the CSP or the like can be made further small.

Furthermore, since the slit hole 16 or the like is formed in the stage of the wiring substrate, prior to the mounting of the semiconductor element, short-circuit and deficiency of the wiring layer group can be evaluated electrically. Accordingly, in addition to the simplification of the inspection step, the yield also can be improved.

Further, the cutting operation of the wiring substrate in the final step need only cut at the connecting portions. Therefore, in addition to the management process and operation method becoming remarkably easy, since, for this cutting operation, a precision tool such as a sintered carbide tool can be employed, a high yield can be attained. Thereby, the cost reduction can be attained. Further, by the use of the sintered carbide tool or the like, the superfluous resin flow portions formed during mold formation at the positions of the gate and the air vent can be also cut simultaneously, thereby the CPS of excellent quality can be obtained.

As described above, according to the present invention, the mold resin is prevented from going outside of the pushing face of the metal mold to ensue the burr. Accordingly, a thin and small size resin-molded semiconductor device of excellent appearance and characteristic can be obtained. Further, by separating by use of the slit holes, the separating operation at the final step can be carried out easily, further there is hardly required to have the separating margin from the mold line. Accordingly, the semiconductor device such as the CPS or the like can be made further small.

What is claimed is:

1. A semiconductor device, comprising:

a wiring substrate having a wiring layer of at least one main face of a substrate composed of a resin impregnated glass cloth;

a semiconductor element mounted and assembled on the main face of the wiring substrate;

a transfer molded resin layer covering and sealing an outside of the semiconductor element; and a plurality of external connecting terminals disposed on the other main face of the wiring substrate;

wherein below an external form line of the transfer molded resin layer and between the transfer molded resin layer and the wiring substrate, a protrusion comprising an insulating resin is formed by stacking at least two resin layers.

2. The semiconductor device as set forth in claim 1, further comprising a protective layer mainly consisting of an insulating resin formed on the wiring substrate covering the wiring layer, and the lower layer of the protrusion is the protective layer.

3. The semiconductor device as set forth in claim 2, wherein the lower layer constituting the protrusion is a photo-setting solder resist layer, and an upper layer is a thermosetting solder resist layer.

4. A semiconductor device, comprising:

a wiring substrate having a wiring layer on at least one main face of a substrate composed of a resin impregnated glass cloth;

a semiconductor element mounted and assembled on the main face of the wiring substrate;

a transfer molded resin layer covering and sealing an outside of the semiconductor element;

a plurality of external connecting terminals disposed on the other main face of the wiring substrate; and a protrusion comprising an insulating resin formed below an external form line of the transfer molded resin layer and between the transfer molded resin layer and the wiring substrate, wherein a part of an external periphery edge surface of the wiring substrate is an internal periphery edge surface of a slit hole which is die cut along the external form line of the transfer molded resin layer.

* * * * *

UNITED STATES PATENT AND TRADEMARK OFFICE
CERTIFICATE OF CORRECTION

PATENT NO. : 6,365,979 B1
DATED : April 2, 2002
INVENTOR(S) : Miyajima

It is certified that error appears in the above-identified patent and that said Letters Patent is hereby corrected as shown below:

Column 9,
Line 28, change "of at least" to -- on at least --.

Signed and Sealed this

Second Day of July, 2002

Attest:

JAMES E. ROGAN
Attesting Officer
Director of the United States Patent and Trademark Office